(12) United States Patent
Wang et al.

(10) Patent No.: US 9,323,273 B2
(45) Date of Patent: Apr. 26, 2016

(54) CURRENT STEERING MODE DIGITAL-TO-ANALOG CONVERTER CIRCUIT CONFIGURED TO GENERATE VARIABLE OUTPUT CURRENT

(71) Applicant: STMicroelectronics (Shenzhen) R&D Co. Ltd, Shenzhen (CN)

(72) Inventors: Meng Wang, Shenzhen (CN); Xue Lian Zhou, Shenzhen (CN)

(73) Assignee: STMICROELECTRONICS (SHENZHEN) R&D CO. LTD, Shenzhen (CN)

(*) Notice: Subject to any disclaimer, the term of this patent is extended or adjusted under 35 U.S.C. 154(b) by 0 days.

(21) Appl. No.: 14/504,494

(22) Filed: Oct. 2, 2014

(65) Prior Publication Data

US 2016/0062384 A1   Mar. 3, 2016

(30) Foreign Application Priority Data

Aug. 29, 2014 (CN) .......................... 2014 1 0448786

(51) Int. Cl.
   *H05B 37/02* (2006.01)
   *G05F 3/26* (2006.01)
   *H05B 33/08* (2006.01)

(52) U.S. Cl.
   CPC ............ *G05F 3/262* (2013.01); *H05B 33/0809* (2013.01)

(58) Field of Classification Search
   CPC .......... H05B 37/02; H03M 1/66; H03M 1/76; H03M 1/742; H03M 1/745; H03M 1/747
   USPC ...... 315/209 R, 291, 294, 297, 307, 308, 312
   See application file for complete search history.

(56) References Cited

U.S. PATENT DOCUMENTS

2013/0057420 A1* 3/2013 Oku .................... H03M 1/0604
                                                                  341/136

\* cited by examiner

*Primary Examiner* — Jimmy Vu
(74) *Attorney, Agent, or Firm* — Gardere Wynne Sewell LLP

(57) ABSTRACT

A current source circuit is configured to receive a reference current at the input circuit path of a current mirror circuit. The current mirror circuit mirrors the reference current and generates mirror currents at a number of output circuit paths. A corresponding number of control transistors are connected in series with the output circuit paths. Each control transistor is selectively actuated in response to a control signal. A decoder circuit is configured to receive a variable control signal and generate actuation signals in response thereto to selective actuate the control transistors to pass the mirror current to an output node. At the output node, the passed mirror currents are summed to generate a variable output current. The variable current is monotonically modulated in response to the variable control signal.

22 Claims, 4 Drawing Sheets

US 9,323,273 B2

CURRENT STEERING MODE DIGITAL-TO-ANALOG CONVERTER CIRCUIT CONFIGURED TO GENERATE VARIABLE OUTPUT CURRENT

CROSS-REFERENCE TO RELATED APPLICATIONS

Pursuant to 35 U.S.C. §119(a)-(d), this application claims the priority of Chinese Patent Application Serial No. 201410448786.3, filed Aug. 29, 2014, which is hereby incorporated by reference in its entirety for all purposes.

TECHNICAL FIELD

This disclosure relates generally to electronic circuits, and more particularly to circuits configured to generate a modulated (variable) current output.

BACKGROUND

Those skilled in the art are well aware of numerous applications in which an output current or voltage must be monotonically modulated. Examples of such applications include, without limitation, light emitting diode (LED) dimming circuits and motor control circuits.

FIG. 1 illustrates an example of a LED dimming circuit 10. The circuit 10 is configured to generate a drive current Id which is applied to a string of LEDs 12. The circuit includes a current mirror circuit 14 having an input circuit path configured to receive a variably controlled current Iv and an output circuit path configured to output the drive current Id at a drive node. The current mirror circuit 14 is formed by a pair of MOSFET transistors 16 and 18. The source terminals of the transistors 16 and 18 are connected to a reference supply node 20 and the gate terminals of the transistors 16 and 18 are coupled together. The source-drain path of transistor 16 defines the input circuit path of the current mirror circuit 14 configured to receive the variable current Iv, and the source-drain path of transistor 18 defines the output circuit path of the current mirror circuit 14 coupled to the drive node and configured to supply the drive current Id. A differential amplifier 22 is provided to control the accuracy of the current mirroring operation performed by the mirror circuit 14. The non-inverting input (+) of the amplifier 22 is connected to the drain terminal of the transistor 16 and the inverting input (−) of the amplifier 22 is connected to the drain terminal of the transistor 18. The output of the amplifier 22 is connected to the commonly-connected gate terminals of the transistors 16 and 18.

The variably controlled current Iv is generated by a current source circuit 30. The current source circuit 30 receives a reference current Iref and generates the variably controlled current Iv as a function of the reference current Iref and a control input Cv (wherein the control input Cv specifies a proportional functional relationship between Iref and Iv that depends on input Cv). The variable current Iv thus varies in response to changes in the control input Cv, and as a result, through the current mirroring function, the drive current Id also varies in response to the input Cv. This variation in the drive current Id in response to change in the control input Cv causes a variation in the light output from the LED string 12. By varying the control input Cv, a dimming of the light produced by the LED string 12 is provided.

It is important in the dimming operation for a monotonic relationship to exist between the change in the control input Cv and the change in the variably controlled current Iv. There is accordingly a need in the art for a current source circuit capable of ensuring delivery of such a monotonic relationship.

SUMMARY

In an embodiment, a circuit comprises: an input node; an output node; a current mirror circuit including an input transistor coupled to the input node and a plurality of output transistors coupled to the input transistor; a plurality of control transistors, each control transistor coupled in series with one of said plurality of output transistors, the plurality of control transistors coupled to the output node; and a decoder circuit having an input configured to receive a control signal and a plurality of outputs coupled to corresponding control terminals of the control transistors; wherein said decoder circuit is configured to decode the control signal and selectively actuate the control transistors in response thereto.

In an embodiment, A circuit comprises: an input node configured to receive a reference current; a current mirror circuit having an input circuit path configured to receive said reference current and further having a plurality of output circuit paths; a plurality of control transistors, each control transistor coupled in series with one of said output circuit paths, the plurality of control transistors coupled to an output node; and a decoder circuit having an input configured to receive a variable control signal and having a plurality of outputs coupled to corresponding control terminals of the control transistors, wherein said decoder circuit is configured to convert a magnitude of the variable control signal to a number of control transistors to be actuated and further generate actuation signals at said plurality of outputs to selectively actuate said number of control transistors so as to generate a variable current at said output node that is monotonically modulated in response to said variable control signal.

In an embodiment, a method comprises: receiving a reference current; mirroring the reference current to generate a plurality of mirror currents; receiving a variable control signal; converting a magnitude of the variable control signal to a plurality of actuation signals; and selecting mirror currents for summed output to generate a variable current in response to said actuation signals.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Figure 1:
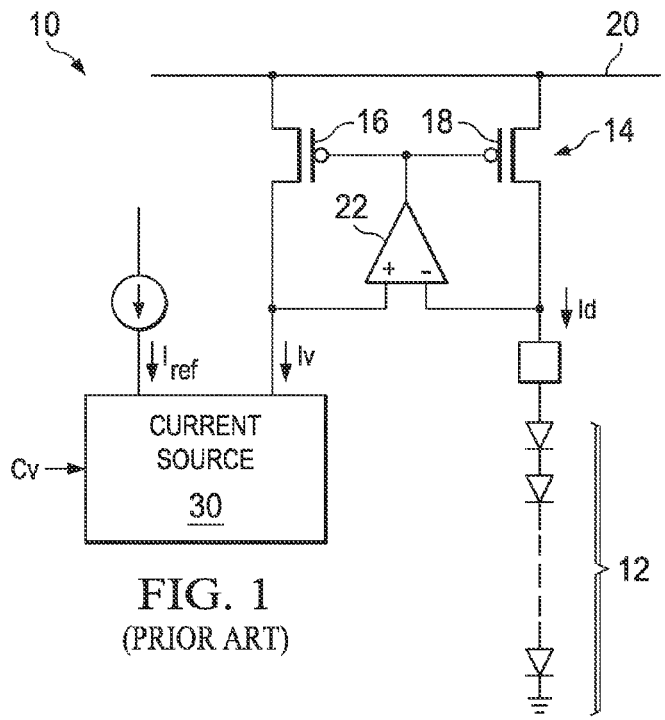
FIG. 1 is a circuit diagram for an LED dimming circuit.
Figure 2:
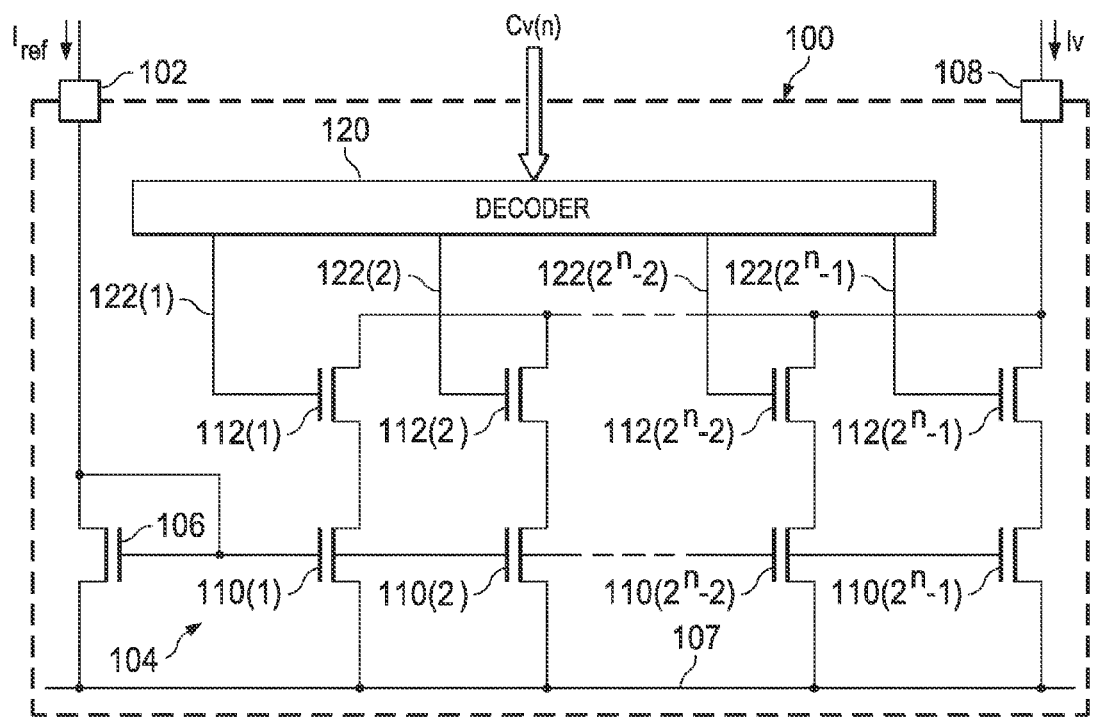
FIG. 2 is a circuit diagram of a current steering mode digital-to-analog converter circuit.

Reference is now made to FIG. 2 which illustrates a circuit diagram of a current steering mode digital-to-analog converter circuit 100. The circuit 100 may, for example, be used as a current source circuit (such as for use in the circuit 30 of FIG. 1). The circuit 100 includes an input node 102 configured to receive a reference current Iref. The input node 102 is connected to an input circuit path of a current mirror circuit 104, wherein the input circuit path is formed by the source-drain path of an input MOSFET transistor 106. The source terminal of the input transistor 106 is connected to a reference supply node 107 and the drain terminal of the input transistor 106 is connected to the input node 102. The drain terminal of the input transistor 106 is further connected to the gate terminal of the input transistor 106 in a diode-connected circuit configuration for the input transistor of a current mirror circuit. The circuit 100 further includes an output node 108 configured to generate a variably controlled current Iv. The output node is connected to a plurality ($2^n-1$) of output circuit paths of the current mirror circuit 104. Each of the $2^n-1$ output circuit paths is formed by the series connection of the source-drain paths of an output MOSFET transistor 110(1)-110($2^n-1$) and a corresponding MOSFET control transistor 112(1)-112($2^n-1$). The device ratio for the transistors 106 and 110 may be set by the circuit designer. In a simple implementation, the ratio may be 1:1. In practice, however, the ratio may instead comprise: 4:1, 8:1, etc. in order to improve layout matching. The source terminals of the output transistors 110 are connected to the reference supply node 107 and the drain terminals of the output transistors 110 are connected through the corresponding control transistor 112 to the output node 108. The gate terminals of the output transistors 110 are connected to the gate terminal of the input transistor 106 in support of the current mirror circuit 104 configuration. The source terminal of each control transistor 112 is connected to the drain terminal of the corresponding output transistor 110 for the output circuit path, and the drain terminals of all of the control transistors 112 are connected to the output node 108. The circuit 100 further includes a decoder circuit 120 configured to receive a control input Cv signal. In a embodiment, the control input Cv is formed by an n-bit digital signal, with the decoder circuit 120 functions as a binary-to-thermometer decoder to decode the n-bit Cv control input and generate a $2^n-1$ bit gate control output comprising signals 122(1)-122($2^n-1$). The signals 122(1)-122($2^n-1$) are connected for application to the gate terminals of the MOSFET control transistors 112(1)-112($2^n$), and thus control whether the transistors 112 are turned on or off. In this way, the transistors 112 function as switching circuits to selectively connect the output circuit paths to the output node 108 in response to the decoded control input Cv.

The input and output nodes 102 and 108 may comprise pads or pins of an integrated circuit in an implementation where the circuit 100 is fabricated as an integrated circuit device.

In one non-limiting example of an implementation, n=3 and thus $2^n-1=7$, so the circuit 100 would include seven output circuit paths of the current mirror circuit 104, with the seven control transistors 112(1)-112(7) selectively actuated in response to the decoding of the three-bit Cv input. This may be better understood by reference to an example. So, if the 3-bit control input Cv is <011> (i.e., the input has a magnitude of "three"), then the $2^n-1$ bit gate control output is <000_0111> and three control transistors 112(1), 112(2) and 112(3) would be actuated by the logic high signals 122 output from the decoder circuit 120. Conversely, if the 3-bit control input Cv is <101> (i.e., the input has a magnitude of "five"), then the $2^n-1$ bit gate control output is <001_1111> and five control transistors 112(1), 112(2), 112(3), 112(4) and 112(5) would be actuated by the logic high signals 122 output from the decoder circuit 120.

The reference to n=3 above is by example only. In an implementation, n=9. It will be understood that n can be any selected integer value dependent on the desired granularity for controlling variation in the current Iv.

Although the decoder circuit 120 is implemented as a digital decoder, it will be understood that alternative implementations may utilize a decoder which is configured to receive an analog control input Cv, with the decoder circuit 120 operating to convert a magnitude of the analog input signal to the signals 122W-122($2^n-1$) and thus selectively actuate the control transistors 112(1)-112($2^n$) based on that magnitude in a manner similar to that effectuated with the foregoing digital example.

In one embodiment, the circuit 100 operates as follows: the reference current Iref is received and mirrored to generate a plurality of mirror currents at each of the output transistors 110. The decoder circuit 120 receives the control signal Cv and converts a magnitude of the control signal to a plurality of actuation signals. The actuation signals have either an active or inactive state. The number of actuation signals having the active state corresponds to the magnitude of the control signal Cv. Thus, a control signal with a relative magnitude of "five" will be decoded by the circuit 120 to produce "five" actuation signals in the logic high (active) state. The actuation signals in the active state cause their corresponding control transistors 112 to be turned on in a switching operation to pass the corresponding mirror currents to the output node 108. The output node 108 functions as a current summing node to generate the output variable current Iv. The output variable current Iv is thus equal to the sum of the mirror currents which have a been selected through the active state of the actuation signals output from the decoder circuit. The output variable current Iv is monotonically modulated in response to the control signal Cv.

Figure 3:
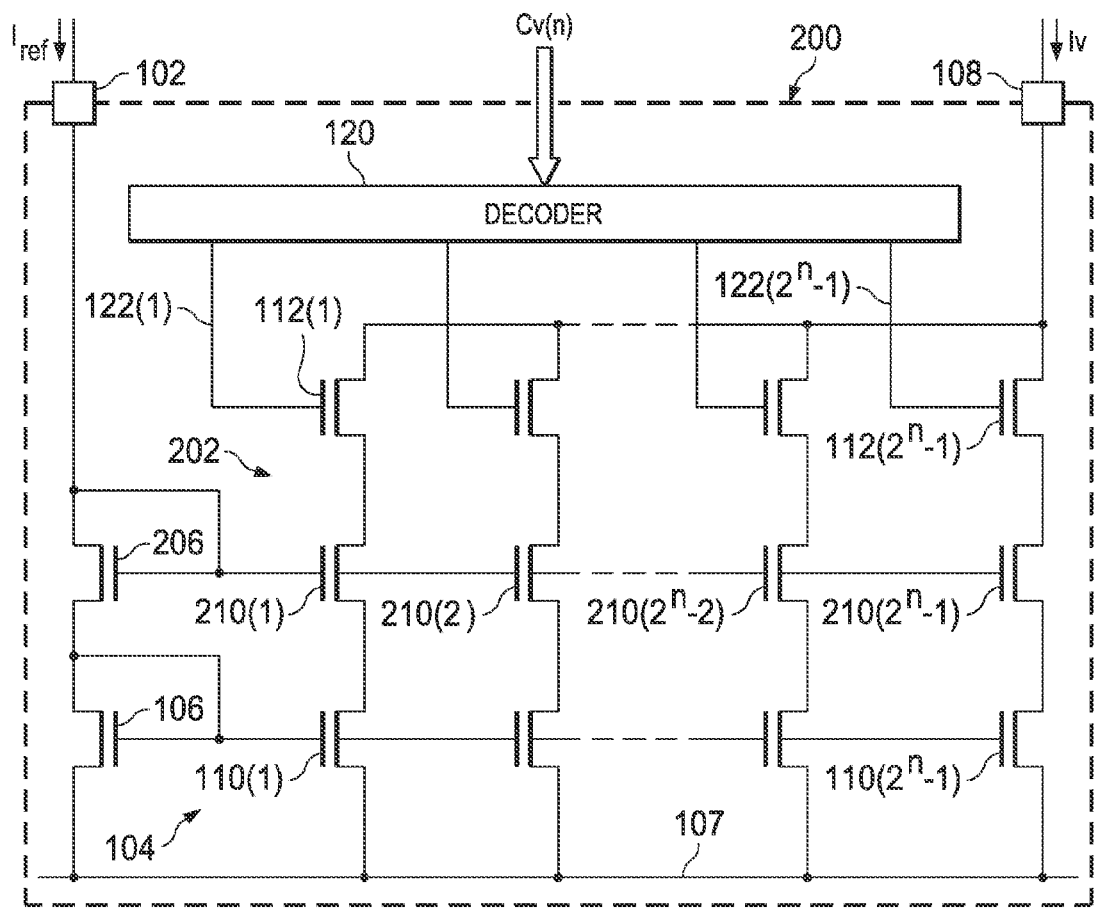
FIG. 3 is a circuit diagram of a current steering mode digital-to-analog converter circuit.

Reference is now made to FIG. 3 which illustrates a circuit diagram of a current steering mode digital-to-analog converter circuit 200. The circuit 200 may, for example, be used as a current source circuit (such as for use in the circuit 30 of FIG. 1). Like reference numbers in FIG. 3 refer to like or similar parts in FIG. 2.

The circuit 200 of FIG. 3 differs from the circuit 100 of FIG. 2 in that the circuit 200 of FIG. 3 includes a cascode circuit 202. The cascode operation supports matching. In order for two identical NMOS devices to have the same drain current, all three terminals of the NMOS devices should be at the same potential. In FIG. 2, the transistors 106 and 110(1) have the same gate and source voltages, but the drain voltages may differ. Because of the finite output impedance of transistor 110(1), its drain current may thus differ from transistor 106. The circuit of FIG. 3 addresses this issue by using the cascode circuit 202. The cascode circuit 202 includes an input MOSFET cascode transistor 206 connected to the input circuit path of the current mirror circuit 104. In particular, the source-drain paths of the transistors 106 and 206 are connected in series. The source terminal of transistor 206 is connected to the drain terminal of transistor 106, and the drain terminal of transistor 206 is connected to the input node 102. The drain terminal of transistor 206 is also connected to the gate terminal of transistor 206 to provide a diode-connected arrangement. Each of the $2^n-1$ output circuit paths is formed by the series connection of the source-drain paths of the output transistor 110(1)-110($2^n-1$), an output MOSFET cascode transistor 210(1)-210($2^n-1$) and the control transistor 112(1)-112($2^n-1$). In an embodiment providing for device matching, the device ratio of transistors 206 and 210 should match the device ratio of transistors 106 and 110. The source terminal of each transistor 210 is connected to the drain terminal of a corresponding transistor 110, and the drain terminal of each transistor 210 is connected to the source terminal of a corresponding transistor 112. The gate terminals of the output cascode transistors 210 are connected to the gate terminal of the input cascode transistor 206. This circuit configuration forces transistors 106 and 110(1) to have the same drain voltage which is equal to the gate voltage of transistor 206 minus the gate-to-source voltage of transistor 206, resulting in improved matching.

Figure 4:
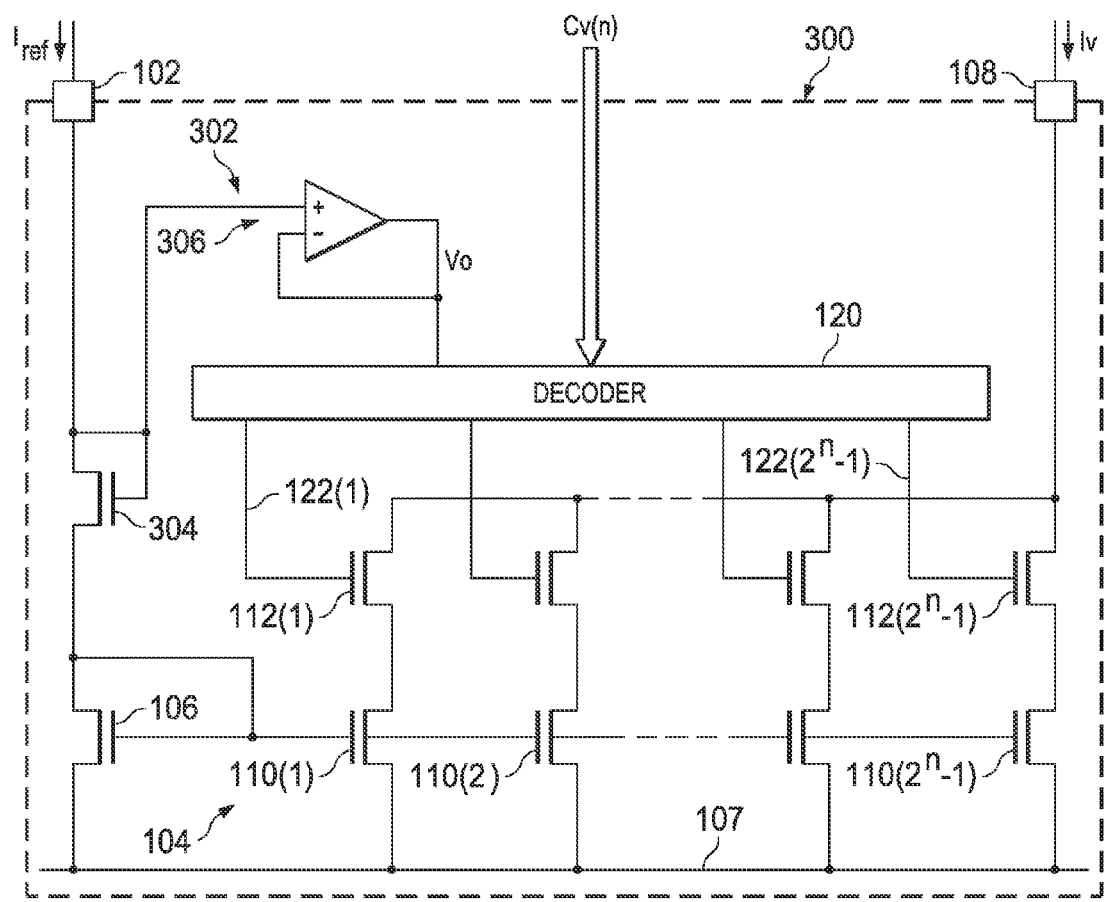
FIG. 4 is a circuit diagram of a current steering mode digital-to-analog converter circuit.

Reference is now made to FIG. 4 which illustrates a circuit diagram of a current steering mode digital-to-analog converter circuit 300. The circuit 300 may, for example, be used as a current source circuit (such as for use in the circuit 30 of FIG. 1). Like reference numbers in FIG. 4 refer to like or similar parts in FIG. 2.

The circuit 300 of FIG. 4 differs from the circuit 100 of FIG. 2 in that the circuit 300 of FIG. 4 further illustrates the power supply circuitry 302 for the decoder circuit 120. The power supply circuitry 302 includes a MOSFET transistor 304 having a source-drain path coupled in series with the source-drain path of transistor 106 for the input circuit path of the current mirror circuit 104. The source terminal of transistor 304 is connected to the drain terminal of transistor 106, and the drain terminal of transistor 304 is connected to the input node 102. The drain terminal of transistor 304 is further connected to the gate terminal of transistor 304 to provide a diode-connected arrangement. The power supply circuitry 302 further comprises a voltage regulator circuit 306 including a differential amplifier having a non-inverting input (+) connected to the gate-drain of the transistor 304. Because transistors 106 and 206 are diode connected, the voltage applied to the non-inverting input (+) of the differential amplifier as a reference voltage is equal to the sum of two diode voltage drops. The output of the amplifier is connected to the inverting input (−) in a feedback connection. In this configuration, the voltage regulator circuit 306 functions to apply the received reference voltage as the output supply voltage Vo connected to a supply input of the decoder circuit. In an implementation, the voltage Vo is smaller than logic high voltage for digital bits of the Cv input.

In the circuit of FIG. 4, the gate of transistor 112(1) is connected to the output of the decoder. Because the decode is powered from the power supply circuitry 302 with a power supply voltage regulated to equal the voltage at the gate of transistor 304, the gate of transistor 112(1) will be actuated by a control signal voltage that is also equal to the voltage at the gate of transistor 304. The gate voltage of transistor 304 is equal to the gate-to-source voltage of transistor 106 plus the gate-to-source voltage of transistor 304. When transistor 112(1) is turned on, the gate voltage of transistor 112(1) will also equal to the gate-to-source voltage of transistor 106 plus the gate-to-source voltage of transistor 304 (because of the regulating function of the circuitry 302). In this condition, the drain voltage of transistor 112(1) will equal the gate-to-source voltage of transistor 106 plus the gate-to-source voltage of transistor 304 minus the gate-to-source voltage of transistor 112(1). The transistors 304 and 112(1) are designed to match (or at least have similar device ratios), and this results in the drain voltage of transistor 112(1) equaling the gate-to-source voltage of transistor 106. In this configuration, the transistors 106 and 112(1) are matched. The transistor 112(1) accordingly performs two functions: it operates as a switching device to selectively pass the current from transistor 110(1) to the output node 108, and further operates as a cascode device.

Figure 5:
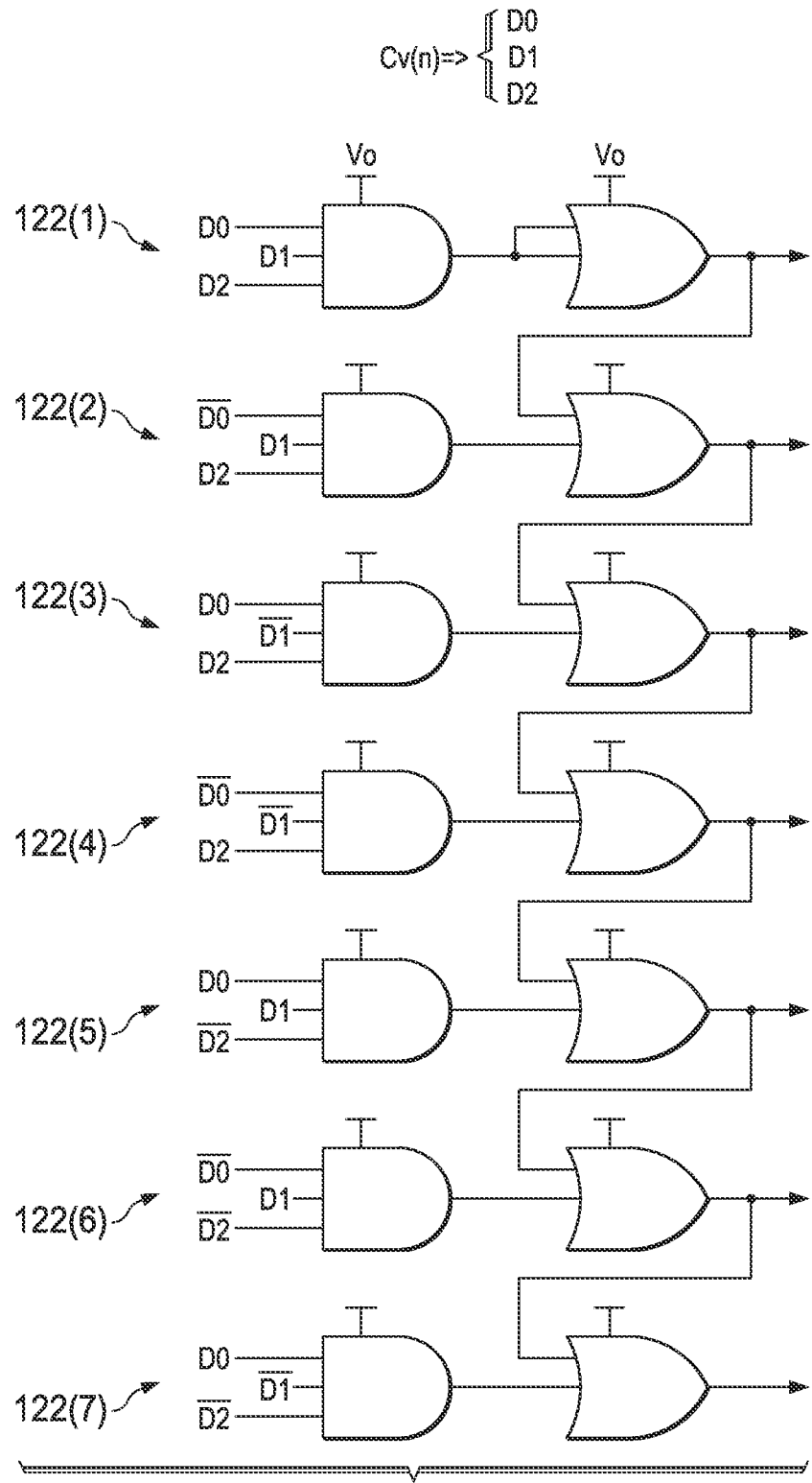
FIG. 5 is a circuit diagram for an example of a thermometer decoder circuit.

Reference is now made to FIG. 5 which shows a circuit diagram for an example of a thermometer decoder circuit 120. In this example, n=3. The circuit of FIG. 5 can be scaled for any value of n. It will be noted that the output supply voltage Vo from the voltage regulator circuit 306 is provided as the positive supply voltage for the AND and OR logic gates of the decoder circuit 120.

As used herein, the terms "connected" and "coupled" (and the variations thereof) do not necessarily require a direct link between parts, components or circuit elements.

It will be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
   an input node;
   an output node;
   a current mirror circuit including an input transistor coupled to the input node and a plurality of output transistors coupled to the input transistor;
   a plurality of control transistors, each control transistor coupled in series with one of said plurality of output transistors, the plurality of control transistors coupled to the output node; and
   a decoder circuit having an input configured to receive a control signal and a plurality of outputs coupled to corresponding control terminals of the control transistors;
   wherein said decoder circuit is configured to decode the control signal and selectively actuate the control transistors in response to the decoded control signal.

2. The circuit of claim 1, wherein the input transistor of the current mirror is a MOSFET having a drain terminal coupled to a gate terminal of said input transistor, and wherein the output transistors are MOSFETs having gate terminals coupled to the gate terminal of the input transistor.

3. The circuit of claim 1, further comprising:
   a diode-connected transistor coupled in series with the input transistor of the current mirror circuit; and
   a regulator circuit having a reference voltage input coupled to the diode-connected transistor and a feedback input coupled to an output of the regulator circuit, wherein the output of the regulator circuit is configured to generate a supply voltage for application to a power supply input of the decoder circuit.

4. The circuit of claim 3, wherein the decoder circuit includes a plurality of logic gates, and wherein said logic gates are supplied by said supply voltage.

5. The circuit of claim 3, wherein the control signal is a digital logic signal having a high logic state, and wherein said supply voltage is less than a voltage of the high logic state.

6. The circuit of claim 3, wherein at least one of the plurality of control transistors is configured, when actuated by the decoder circuit with an actuation voltage equal to said supply voltage, to further function as a cascode device.

7. The circuit of claim 1, wherein the decoder circuit is configured to convert a magnitude of the control signal to a number of control transistors to be actuated and further generate actuation signals for application to the control terminals of the control transistors to actuate said number of control transistors.

8. The circuit of claim 7, wherein the decoder circuit comprises a binary to thermometer decoder, said control signal comprising a binary signal.

9. The circuit of claim 1, further comprising a cascode circuit including:

an input cascode transistor coupled in series with the input transistor of the current mirror circuit; and a plurality of output cascode transistors coupled to the input cascode transistor, each output cascode transistor coupled in series with one of said plurality of output transistors of the current mirror circuit.

10. The circuit of claim 9, wherein the input cascode transistor is a MOSFET having a drain terminal coupled to a gate terminal of said input cascode transistor, and wherein the output cascode transistors are MOSFETs having their gate terminal coupled to the gate terminal of the input cascode transistor.

11. The circuit of claim 1, further comprising an additional current mirror having an input circuit path coupled to the output node and an output circuit path configured to generate a drive current at a drive node.

12. The circuit of claim 11, further comprising one or more light emitting diodes coupled to receive said drive current.

13. The circuit of claim 11, wherein the additional current mirror comprises a differential amplifier having a first input coupled to the output node and a second input coupled to the drive node.

14. The circuit of claim 1, wherein the input node is configured to receive a reference current, and wherein the output node is configured to generate a variable current which varies as a function of the reference current and the control signal.

15. The circuit of claim 14, wherein the variable current is monotonically modulated in response to change in the control signal.

16. A circuit, comprising:
an input node configured to receive a reference current;
a current mirror circuit having an input circuit path configured to receive said reference current and further having a plurality of output circuit paths;
a plurality of control transistors, each control transistor coupled in series with one of said output circuit paths, the plurality of control transistors coupled to an output node; and
a decoder circuit having an input configured to receive a variable control signal and having a plurality of outputs coupled to corresponding control terminals of the control transistors,
wherein said decoder circuit is configured to convert a magnitude of the variable control signal to a number of control transistors to be actuated and further generate actuation signals at said plurality of outputs to selectively actuate said number of control transistors so as to generate a variable current at said output node that is monotonically modulated in response to said variable control signal.

17. The circuit of claim 16, further comprising:
a diode-connected transistor coupled in series with the input circuit path of the current mirror circuit; and
a regulator circuit having a reference voltage input coupled to the diode-connected transistor and a feedback input coupled to an output of the regulator circuit, wherein the output of the regulator circuit is configured to generate a supply voltage for application to a power supply input of the decoder circuit.

18. The circuit of claim 17, wherein at least one of the plurality of control transistors is configured, when actuated by the decoder circuit with an actuation voltage equal to said supply voltage, to further function as a cascode device.

19. The circuit of claim 16, further comprising a cascode circuit including:
an input cascode transistor coupled in series with the input circuit path of the current mirror circuit; and
a plurality of output cascode transistors coupled to the input cascode transistor, each output cascode transistor coupled in series with one of said output circuit paths of the current mirror circuit.

20. A method, comprising:
receiving a reference current at a first input;
mirroring the reference current to generate a plurality of mirror currents;
receiving a variable control signal at a second input;
converting a magnitude of the variable control signal to a plurality of actuation signals; and
selecting by a selection circuit of mirror currents for summed output to generate a variable current in response to said actuation signals.

21. The method of claim 20, wherein selecting comprises actuating switching transistors.

22. The method of claim 21, further comprising configuring at least of said switching transistors, when actuated, to function as a cascode device.

* * * * *